(12) United States Patent
Ota

(10) Patent No.: US 7,557,398 B2
(45) Date of Patent: Jul. 7, 2009

(54) SEMICONDUCTOR DEVICE HAVING A COMPENSATION CAPACITOR IN A MESH STRUCTURE

(75) Inventor: Ken Ota, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 71 days.

(21) Appl. No.: 11/401,293

(22) Filed: Apr. 11, 2006

(65) Prior Publication Data

US 2006/0226462 A1 Oct. 12, 2006

(30) Foreign Application Priority Data

Apr. 11, 2005 (JP) ............................. 2005-113515

(51) Int. Cl.
*H01L 27/108* (2006.01)
*H01L 29/94* (2006.01)

(52) U.S. Cl. ...................... 257/300; 257/296; 257/532; 257/534; 257/E27.048

(58) Field of Classification Search ........................ None
See application file for complete search history.

(56) References Cited

U.S. PATENT DOCUMENTS

| 7,038,296 B2 * | 5/2006 | Laws ........................... 257/534 |
| 7,309,906 B1 * | 12/2007 | Tyhach et al. ................ 257/532 |
| 2004/0206983 A1 * | 10/2004 | Yi et al. ....................... 257/202 |
| 2005/0127972 A1 * | 6/2005 | Chen et al. .................. 327/218 |

FOREIGN PATENT DOCUMENTS

| JP | 04-130667 | 5/1992 |
| JP | 10-032311 | 2/1998 |
| JP | 11-297841 | 10/1999 |
| JP | 2000-114463 | 4/2000 |
| JP | 2001-274255 | 10/2001 |
| JP | 2002-9161 | 1/2002 |
| JP | 2004-071837 | 3/2004 |
| JP | 2004-104136 | 4/2004 |
| JP | 2004-119857 | 4/2004 |

* cited by examiner

*Primary Examiner*—Sue Purvis
*Assistant Examiner*—Leslie Pilar Cruz
(74) *Attorney, Agent, or Firm*—Young & Thompson

(57) ABSTRACT

The compensation capacitor includes: a charge accumulating element having a diffusion layer, a dielectric layer, and a gate electrode layer, wherein the gate electrode layer, the dielectric layer, and the diffusion layer are stacked in this order, and at least partially overlap with each other when viewed from a direction of stacking; a metal layer for applying a voltage to the diffusion layer, the metal layer being formed above the charge accumulating element; and a contact for electrically connecting the diffusion layer and the metal layer, the contact extending between the diffusion layer and the metal layer in the direction of stacking. The gate electrode layer has a form of a mesh which extends in a direction which is perpendicular to the direction of stacking. The contact extends through an aperture of the mesh of the gate electrode layer.

4 Claims, 7 Drawing Sheets

PRIOR ART

PRIOR ART

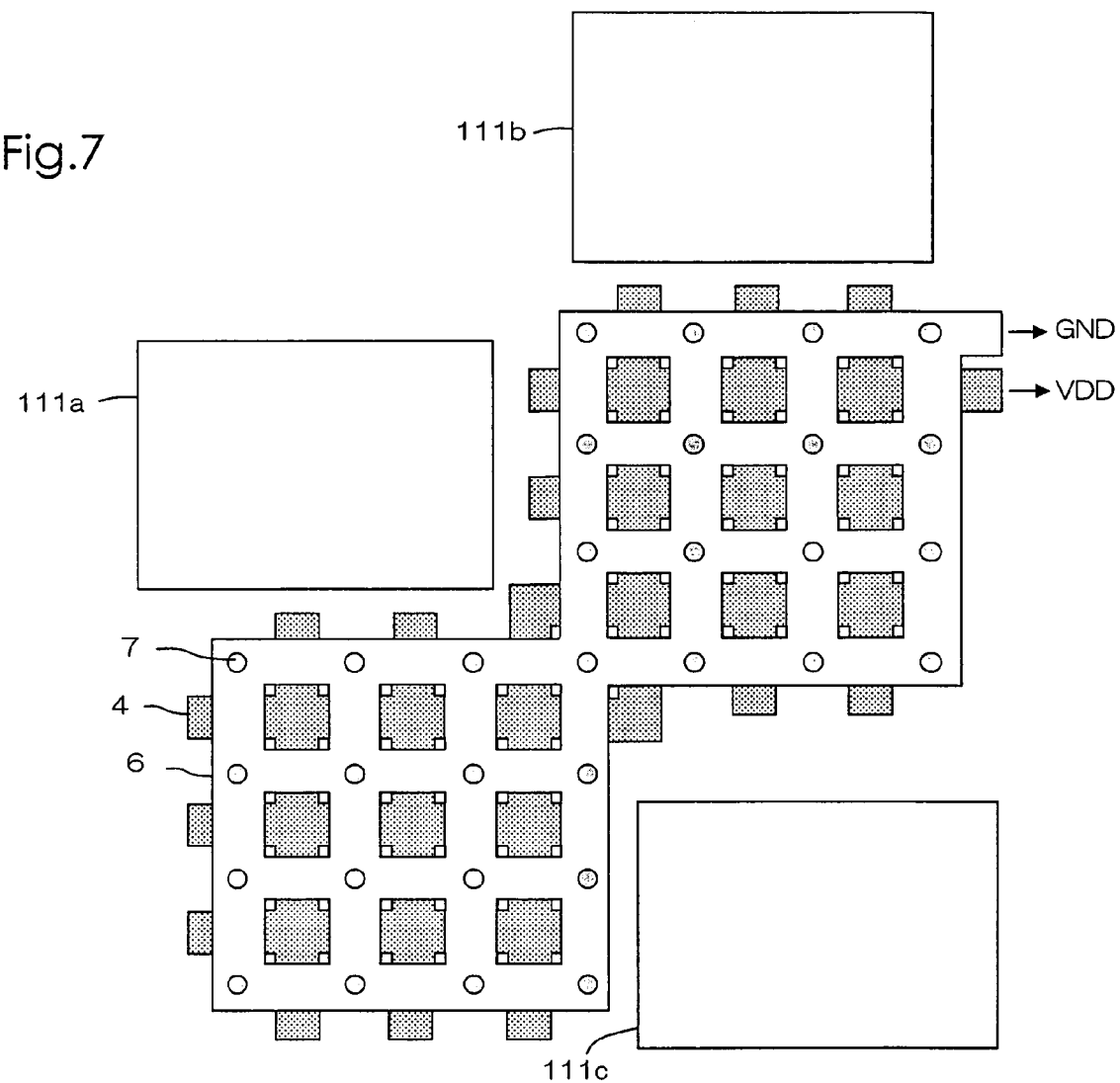

SEMICONDUCTOR DEVICE HAVING A COMPENSATION CAPACITOR IN A MESH STRUCTURE

BACKGROUND OF THE INVENTION

1. Field of the Invention

The present invention relates to a semiconductor device and a method for manufacturing the same, and more particularly to the structure of a compensation capacitor in DRAM.

2. Description of the Related Art

Conventionally, a semiconductor device, which is typically DRAM (Dynamic Random Access Memory), is provided with an internal power supply. The internal power supply supplies power to circuitry which is mounted on a substrate and which performs predetermined functions. Although the internal power supply supplies power to the circuitry when the circuitry is in operation, a large variation in voltage may occur and the operation of the semiconductor device is apt to become instable, if the power is supplied only by the internal power supply. For this reason, so-called compensation capacitor is generally provided on a substrate and is connected to the internal power to stabilize the voltage.

The structure of a prior art compensation capacitor will be described with reference to drawings. FIGS. 1A and 1B are a top plan view and a cross-sectional view illustrating the basic structure of a unit cell of a compensation capacitor, respectively. FIG. 2 is a top plan view of a compensation capacitor which has many unit cells that are arranged in array. Diffusion layer 102, dielectric layer 103, and gate electrode 104 are stacked in this order on a substrate, not shown. Diffusion layer 102 and gate electrode 104 are formed in a plurality of rows. Each row of diffusion layer 102 and each row of gate electrode 104 extend in a perpendicular relationship to one another, as shown in FIG. 2. An intersection of diffusion layer 102 and gate electrode 104 defines overlap portion 111 in which diffusion layer 102, dielectric layer 103 and gate electrode 104 overlap with each other to form a capacitor. Forming diffusion layer 102 and gate electrode 104 in such a plurality of individual rows facilitates the formation of many overlap portions 111, in which diffusion layer 102 and gate electrode 104 overlap with each other, leading to efficient formation of capacitors. Contacts 107 extend from diffusion layer 102 to metal layer 106 in the direction of stacking, with the end thereof in contact with metal layer 106. Insulating layer 105 is disposed between dielectric layer 103 and metal layer 106. Metal layer 106 further extends in parallel with the stacked layers, and is grounded. The rows of gate electrode 104 extend in parallel with the stacked layers, and are connected to power supply $V_{DD}$ row by row through contacts 109. Thus each row is applied with a predetermined voltage. Since the interface with power supply $V_{DD}$ is provided on one side of compensation capacitor 134, contacts 109 are arranged in a line, as illustrated in FIG. 2.

In general, since the main portion of DRAM is formed in the form of a MOS (Metal Oxide Semiconductor) transistor, a compensation capacitor has a similar configuration. A silicon oxide film, which forms a gate insulating film as a part of the gate in a memory unit, not shown, can also be utilized as dielectric layer 103 of compensation capacitor 134. Consequently, dielectric layer 103 of compensation capacitor 134, which is made of a silicon oxide film, can be formed together with the memory cell at one time to simplify the manufacturing process.

As described above, since the compensation capacitor is generally formed in multiple layers due to the configuration which is similar to that of main portions it is important to make each layer flat. A flat surface can be obtained by prior art planarization techniques, and among others, the chemical mechanical polishing method (CMP method) is often used as a planarization technique for semiconductor devices. The CMP method uses both the chemical polishing effect and the mechanical polishing effect of an abrasive in order to planarize a surface. However, when a surface that is to be polished includes an area that is covered with an insulating material, and the remaining area includes metal wires or contacts, a sufficiently flat surface cannot be obtained by the CMP method in many cases, if the insulating material is irregularly distributed. Specifically, the area that is widely covered with an insulating material is excessively polished as compared with the remaining area, and the resultant deep recesses may cause defects such as erosion and dishing. For this reason, dummy patterns may be provided on an area that is covered with an insulating material in order to obtain a flat surface in the CMP process, as disclosed in Japanese Patent Laid-open Publication No. 2001-274255 and 2002-9161.

However, since dummy patterns, which are effective in achieving a flat surface, are provided only for the purposes of planarization, they are of no use after the semiconductor device has been finished. The dummy patterns which are provided for such a purpose are not fabricated with sufficient tolerance that would allow them to be used for other purposes.

Further, there are the following disadvantages other than the foregoing in prior art. Specifically, in order to reduce wire lengths and to limit influence on the performance, it is desirable that the compensation capacitor is arranged in the vicinity of an internal power supply because of its close association with the internal power supply. However, actually, the compensation capacitor is not necessarily arranged at ideal locations for reason such as interference with other circuit elements, and in many cases, is arranged in unused areas after the arrangement of other circuit elements are determined. As a result, if there are obstacles such as other circuit elements that are near the compensation capacitor, then the compensation capacitor must be arranged in an irregular shape in order to avoid interference with the obstacles. FIG. 3 is a top plan view of a compensation capacitor that is arranged in the vicinity of obstacles. In order to detour around obstacles 111a-111c, gate electrode 104 cannot linearly extend toward a location which connects with power supply $V_{DD}$. Accordingly, additional connections 104x, 104y must be provided in order to connect gate electrodes which are not connected to power supply $V_{DD}$ to gate electrodes which are connected to power supply $V_{DD}$. Since the arrangement of detour routes cannot be standardized because of the dependency on the arrangement of obstacles 111a-111c, wiring operations must be performed on a case-by-case basis after the compensation capacitor is arranged, leading to worsened operational efficiency. In addition, even if a compensation capacitor could be arranged at a location which would not cause such a disadvantage, dummy patterns would have to be formed in the vacant area in order to avoid the aforementioned problem in the CMP process. Thus, operational efficiency will be worsened in either case.

SUMMARY OF THE INVENTION

It is an object of the present invention to provide a semiconductor device in which a compensation capacitor can be arranged with a high degree of freedom and in which flat layers are easily obtained. It is another object of the present invention to provide a method for manufacturing such a semiconductor device.

A semiconductor device according to the present invention comprises: an internal power supply for supplying power to a circuit element; and a compensation capacitor for supplying power to said internal power supply.

The compensation capacitor includes: a charge accumulating element having a diffusion layer, a dielectric layer, and a gate electrode layer, wherein said gate electrode layer, said dielectric layer, and said diffusion layer are stacked in this order, and at least partially overlap with each other when viewed from a direction of stacking; a metal layer for applying a voltage to said diffusion layer, said metal layer being formed above said charge accumulating element; and a contact for electrically connecting said diffusion layer and said metal layer, said contact extending between said diffusion layer and said metal layer in the direction of stacking. The gate electrode layer has a form of a mesh which extends in a direction which is perpendicular to the direction of stacking. The contact extends through an aperture of the mesh of said gate electrode layer.

In such a semiconductor device, each portion of the gate electrode layer, which corresponds to each cell in the compensation capacitor, is electrically connected to the outside of the compensation capacitor via a part of the mesh structure of the gate electrode layer. Accordingly, even if the compensation capacitor is formed in an irregular shape in an irregular-shaped area, an electric connection can be easily secured between the compensation capacitor and the outside. As a result, the compensation capacitor can be arranged on a substrate, on which many obstacles are formed, with a high degree of freedom. Since the contact extends through an aperture of the mesh of the gate electrode layer, the compensation capacitor does not restrict the arrangement of the contact. In the manufacturing process, if polishing is performed just after the gate electrode layer has been formed, the gate electrode layer, which is formed in a mesh and has an effect that is similar to the effect that is brought by a dummy pattern, can promote the planarization of the surface.

A method for manufacturing a semiconductor device according to the present invention comprises the steps of: stacking a diffusion layer, a dielectric layer, and a gate electrode layer in this order such that said gate electrode layer, said dielectric layer, and said diffusion layer at least partially overlap with each other when viewed from a direction of stacking; forming a contact such that said contact extends from said diffusion layer through said dielectric layer and said gate electrode layer; forming a metal layer on a top surface of said contact; and planarizing a surface of at least one of said diffusion layer, said gate electrode layer, or said metal layer, wherein said surface is exposed when said surface is planarized. The gate electrode layer has a form of a mesh which extends in a direction which is perpendicular to the direction of stacking. The contact extends through an aperture of the mesh of said gate electrode layer. The layer which is to be planarized has a form of a mesh which extends in a direction which is perpendicular to the direction of stacking.

As described above, the present invention can provide a semiconductor device in which a compensation capacitor can be arranged with a high degree of freedom and in which flat layers are easily obtained, as well as a method for manufacturing the same.

The above and other objects, features and advantages of the present invention will become apparent from the following description with reference to the accompanying drawings which illustrate examples of the present invention.

BRIEF DESCRIPTION OF THE DRAWINGS

FIG. 7 is a top plan view of a compensation capacitor that is arranged in the vicinity of obstacles.

DETAILED DESCRIPTION OF THE INVENTION

An embodiment of a semiconductor device according to the present invention will be described with reference to the accompanying drawings. The present invention can be applied to a wide variety of semiconductor devices which have an internal power supply for supplying power to circuitry which constitutes the semiconductor device, and which have a compensation capacitor for supplying power to the internal power supply. In this specification, DRAM will be explained as an example.

Figure 4:
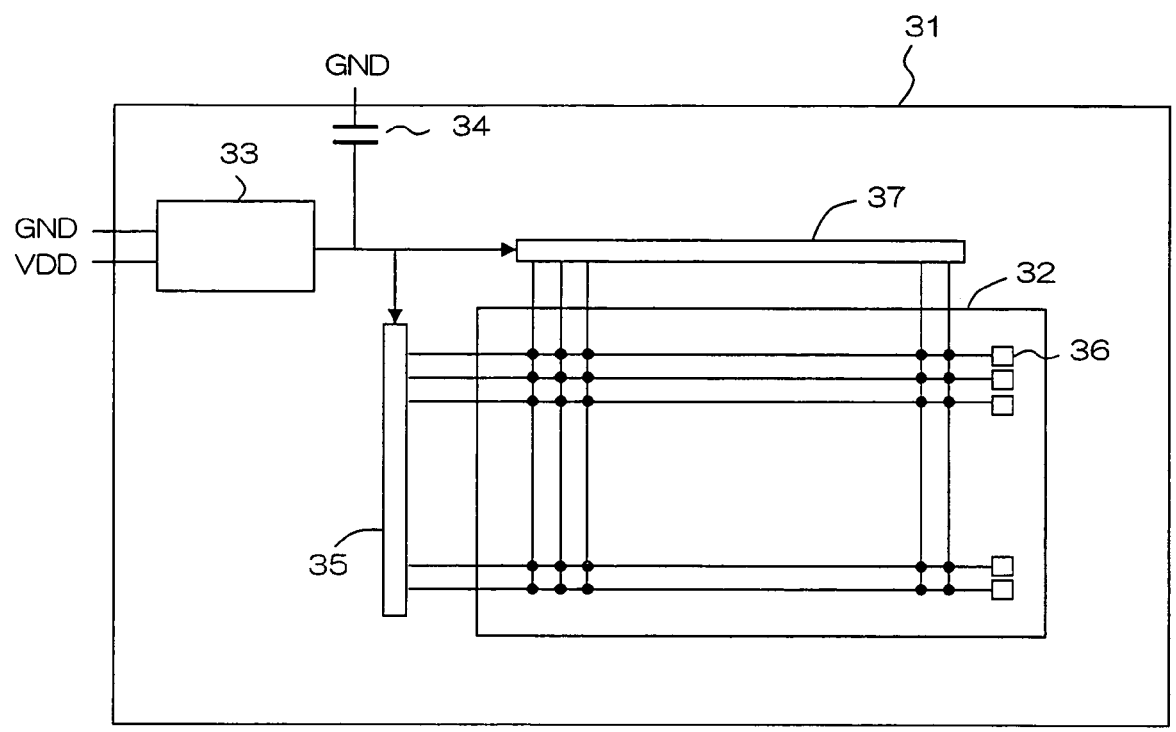
FIG. 4 is a conceptual circuit diagram of the main portion of DRAM according to the present invention.
Figure 5A:
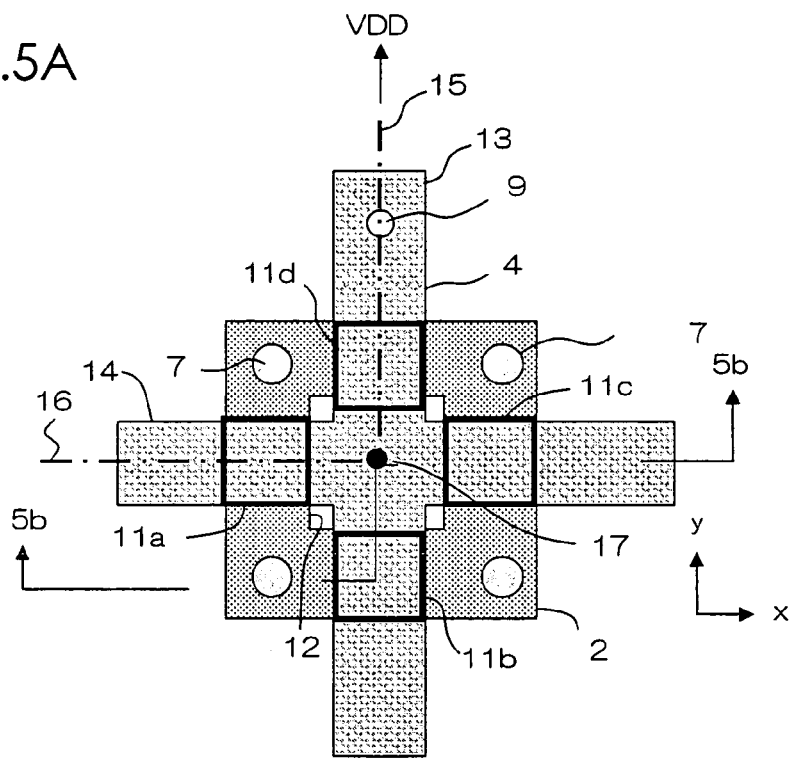
FIGS. 5A and 5B are conceptual diagrams illustrating the basic structure of a unit cell of a compensation capacitor.
Figure 5B:
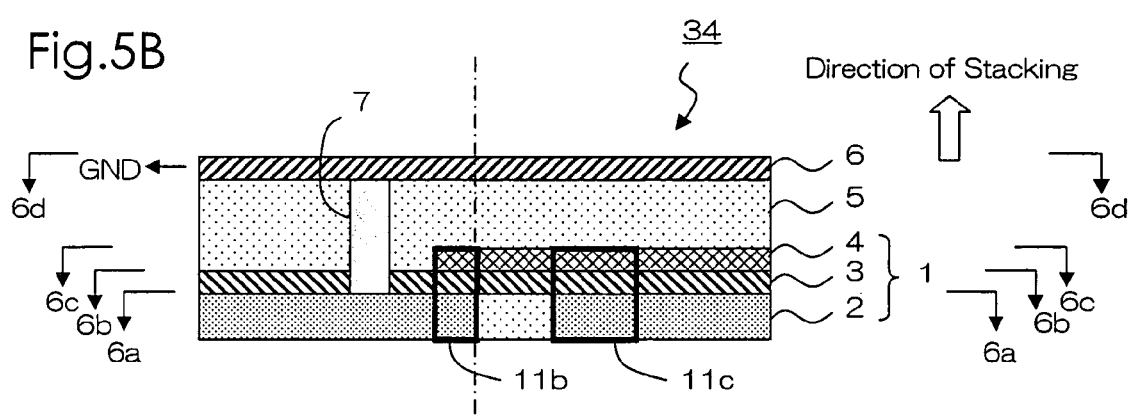

FIG. 4 is a conceptual circuit diagram of the main portion of DRAM according to one embodiment of the present invention. FIG. 5A is a top plan view illustrating the basic structure of a unit cell of a compensation capacitor, and FIG. 5B is a cross-sectional view taken along line 5b-5b in FIG. 5A. FIGS. 6A-6D are plan views of the compensation capacitor illustrated in FIGS. 5A, 5B viewed from several levels in the direction of stacking. Line 6a-6a to line 6d-6d in FIG. 5B correspond to the plan views of FIGS. 6A-6D, respectively. FIG. 7 is a top plan view of a compensation capacitor which is arranged in the vicinity of obstacles.

Referring to FIG. 4, DRAM 31 comprises cell array area 32 which includes circuit elements; internal power supply 33 for supplying power to cell array area 32; and compensation capacitor 34 for supplying power to internal power supply 33. Cell array area 32 consists of memory elements having MOS transistors which are two-dimensionally integrated, and x-decoder 37 and y-decoder 35 are connected to cell array area 32. X-decoder 37 controls each memory cell to open/close the transfer gate, not shown, while y-decoder 35 controls each memory cell to accumulate a charge in the capacitor of each memory cell, not shown, and read the charge from the capacitor. The charge, or current, that is read is amplified by sense amplifier 36, and is sent to an external circuit. Internal power supply 33 supplies power to x-decoder 37 and y-decoder in order to control x-decoder 37 and y-decoder. The transfer gate comprises a gate electrode layer disposed on a semiconductor substrate, and a gate insulating film sandwiched between the substrate and the gate electrode layer. The gate insulating film is made of a silicon oxide film.

Referring to FIGS. 5A, 5B, compensation capacitor 34 comprises charge accumulating element 1 that has diffusion layer 2, dielectric layer 3, and gate electrode layer 4 which are stacked on a semiconductor substrate, not shown, in this order. Metal layer 6, which applies ground voltage to diffusion layer 2, is formed above charge accumulating element 1 with insulating layer 5 sandwiched therebetween. Contact 7 extends from diffusion layer 2 to metal layer 6 in the direction of stacking, and electrically connects diffusion layer 2 with metal layer 6. As a result, diffusion layer 2 is grounded through contact 7. Gate electrode 4 extends in parallel with the stacked layers, and contact 9 is provided near the end portion. Contact 9 extends through compensation capacitor 34 in the direction of stacking, which is indicated by the white arrow in FIG. 5B, and is connected to power supply $V_{DD}$ at a predetermined location.

Figure 6A:
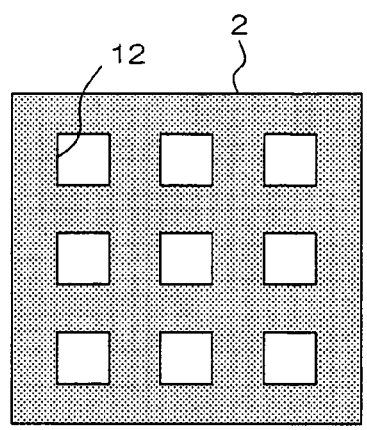
FIGS. 6A-6D are plan views of the compensation capacitor of FIGS. 5A, 5B, viewed from several levels.

The unit cell of diffusion layer 2 has a rectangle form having rectangular aperture 12 in a substantially square form in the central region, as illustrated in FIG. 5A. Diffusion layer 2 is a high-concentration N-type diffusion region if the substrate is made of a high-concentration P-type substrate. Actually, diffusion layer 2 is an array of unit cells, each having rectangular aperture 12, which is arranged in a matrix, as illustrated in FIG. 6A. Diffusion layer 2 may be formed in an irregular form in order to avoid interference with obstacles in another embodiment, as illustrated in FIG. 7. However, even in such a case, each portion of diffusion layer 2 has a rectangle form in which a plurality of rectangular apertures 12 are arranged in a matrix. Since unit cells are mutually connected to each other, application of a voltage to at least one location of diffusion layer 2 enables the entire area of diffusion layer 2 to be in the same voltage state. Accordingly, at a minimum one contact 7 is sufficient for the entire diffusion layer 2.

Dielectric layer 3 is provided between gate electrode layer 4 and diffusion layer 2, and function as a dielectric material in a capacitor. Dielectric layer 3 is made of a silicon oxide layer, as mentioned above.

Figure 6B:
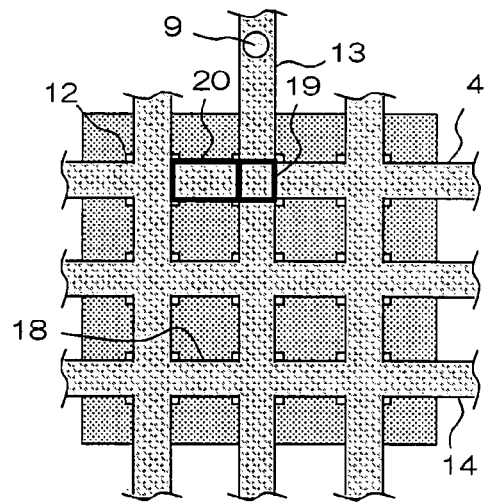

Gate electrode 4, similar to diffusion layer 2, has apertures 18 that are arranged in a matrix, as illustrated in FIG. 6B. In other words, gate electrode layer 4 is formed of a plurality of columns 13 and a plurality of rows 14, and each column 13 and each row 14 is in a substantially perpendicular relationship to one another. Since columns 13 and rows 14 intersect one another, portions of gate electrode layer 4 are electrically connected to each other. Therefore, one connection with power supply $V_{DD}$, or one contact 9, at a minimum, is sufficient for a similar reason to the one which describes diffusion layer 2. Gate electrode 4 is made in a lattice form in order to allow space through which contact 7 extends, to facilitate the electric connection with power supply $V_{DD}$, and in order to ensure the planarizing effect in the CMP process, which will be later described. However, other configurations which achieve these purposes may also be employed for gate electrode layer 4. More generally, gate electrode layer 4 may be in a mesh form which extends in a direction that is parallel to the layers, or in a direction that is perpendicular to the direction of stacking.

Gate electrode 4 is formed such that center line 15 of each column 13 and center line 16 of each row 14 pass through center 17 of corresponding rectangular aperture 12. In other words, rectangular apertures 12 of diffusion layer 2 and apertures 18 of gate electrode layer 4 are arranged at the same intervals, and are shifted by one-half the interval in x- and y-directions. As a result, intersection areas 19 of columns 13 and rows 14 of gate electrode layer 4 are arranged just above rectangular apertures 12 of diffusion layer 2, and remaining area 20, other than intersection areas 19, are arranged above diffusion layer 2, as illustrated in FIG. 6B. The latter area, which is a part of the stacked structure of diffusion layer 2, dielectric layer 3, and gate electrode layer 4, forms a part of overlap portions 11a-11d that work as capacitors, as illustrated in FIGS. 5A, 5B.

Figure 6C:
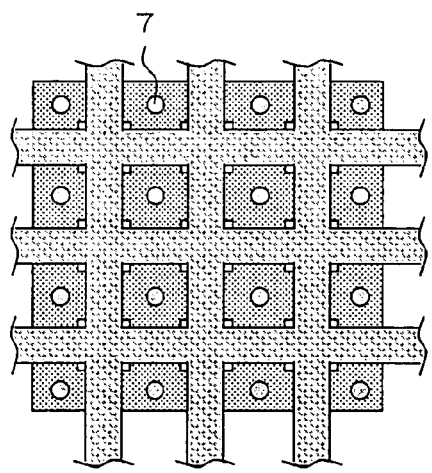

Metal layer 6, similar to gate electrode layer 4, consists of a plurality of columns 21 and a plurality of rows 22, and each column 21 and each row 22 is in a substantially perpendicular relationship to one another. Metal layer 6 extends in parallel with the stacked layers and is grounded. One location at a minimum is sufficient for grounding because of the matrix-like configuration of metal layer 6. Metal layer 6 need not be in a lattice shape, and, similar to gate electrode layer 4, may be in a mesh form which extends in a direction that is parallel to the layers. Contacts 7 extend through apertures 18 to metal layer 6, as illustrated in FIG. 6C.

Diffusion layer 2, gate electrode layer 4, and metal layer 6 preferably have an aperture ratio of approximately 50%. In this specification, the aperture ratio refers to the ratio of the area of aperture to the area that is defined by the periphery of each layer, i.e., diffusion layer 2, gate electrode layer 4, or metal layer 6. This value is close to the aperture ratio of a memory cell, so that the surface of the compensation capacitor can be polished by the CMP under substantially same condition as the memory cell area, as will be later described, and a polished surface that is similar to the memory cell area can be obtained. However, the aperture ratio may be better optimized in accordance with polishing conditions such as the material of slurry and the tracking performance of a pad. The aperture ratio can be adjusted by changing the width and the spacing of a mesh.

Next, a description will be given about a method for manufacturing DRAM according to the present invention. Since the configuration of memory cells and the internal power supply of DRAM is similar to that of prior art, the following description will be focused on the process of manufacturing a compensation capacitor.

First, as illustrated in FIG. 6A, diffusion layer 2 is formed on a substrate by means of a known art such as an ion implantation method. Rectangular apertures 12 of diffusion layer 2 are filled with an insulating layer, not shown. The surface of diffusion layer 2 may be planarized by the CMP as required. Since diffusion layer 2 is formed in a lattice as mentioned above, each portion of the insulating layer is arranged at regular intervals, and thus each portion does not extend in a large area. Accordingly, the entire surface is polished flatly. Next, STI (Shallow Trench Isolation), not shown, is formed in the vicinity of diffusion layer 2, and dielectric layer 3, which is made of a silicon oxide film, is formed.

Next, gate electrode layer 4 is formed such that the above-mentioned positional relationship is established between gate electrode layer 4 and diffusion layer 2, as illustrated in FIG. 6B. Apertures 18 of gate electrode layer 4 are filled with an insulating layer, not shown. The surface of gate electrode layer 4 may be planarized by the CMP as required. Since gate electrode layer 4 is formed in a lattice as mentioned above, each portion of the insulating layer is arranged at regular intervals, and thus each portion does not extend in a large area. Accordingly, the entire surface can be polished flatly. Gate electrode 4 is then covered with insulating layer 5.

Next, holes are formed which extend through insulating layer 5, gate electrode layer 4, and dielectric layer 3. Then, contact 7 made of, for example, titanium nitride is formed, as illustrated in FIG. 6C. The surface of insulating layer 5 may be planarized by the CMP as required.

Figure 6D:
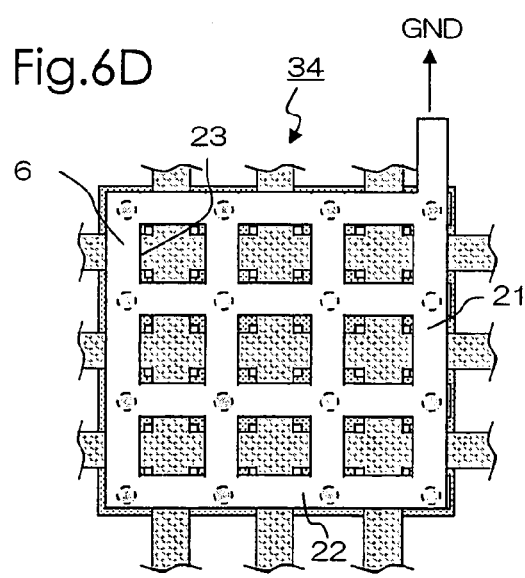

Next, metal film 6 is formed by means of a prior art patterning technique such as photolithography, as illustrated in FIG. 6D. Apertures 23 of metal film 6 are filled with an insulating layer, not shown. The surface of metal film 6 may be planarized by the CMP as required. Since metal film 6 is formed in a lattice as mentioned above, each portion of the insulating layer is arranged at regular intervals, and thus each portion does not extend in a large area. Accordingly, the entire surface can be polished flatly.

The compensation capacitor is manufactured in accordance with the foregoing process. However, the planarization step using the CMP need not be performed in all the steps described above. If the CMP step is performed only for a limited number of layers from among diffusion layer 2, gate electrode layer 4, and metal layer 6, then only the layer which constitutes the surface that is exposed when the CMP is performed, i.e., the layer which is directly polished in the CMP, may be formed in a lattice form. Therefore, other layers which are not directly polished need not be formed in a lattice form, and may be formed in other forms such as a combination of lines which do not intersect one another, or a solid film. However, it is preferable that gate electrode layer 4 is formed in a lattice form even if it is not directly polished, in order to allow space through which contact 7 extends, and to facilitate wiring to the outside of the compensation capacitor.

Figure 1A:
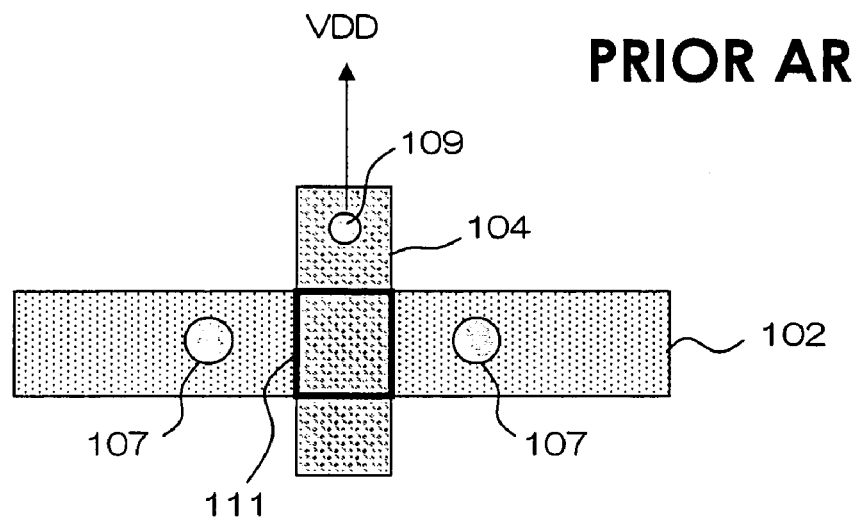
FIGS. 1A, 1B are conceptual diagrams illustrating the basic structure of a unit cell of a prior art compensation capacitor.
Figure 1B:
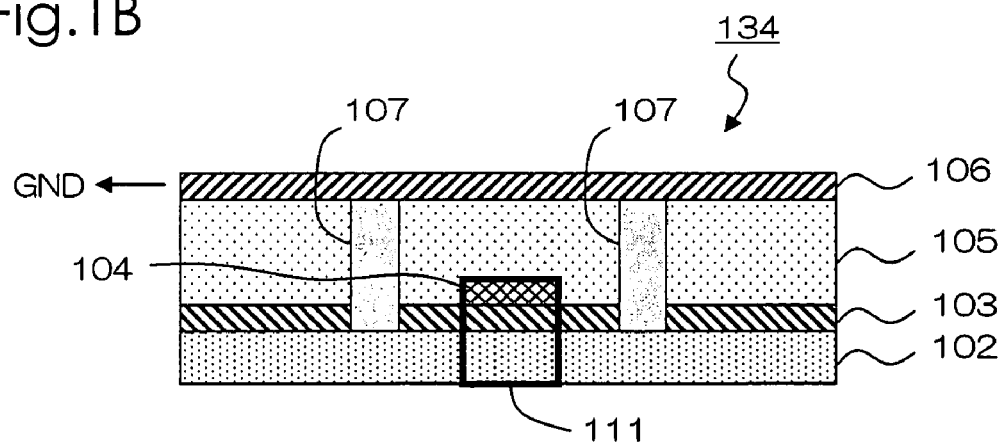
Figure 2:
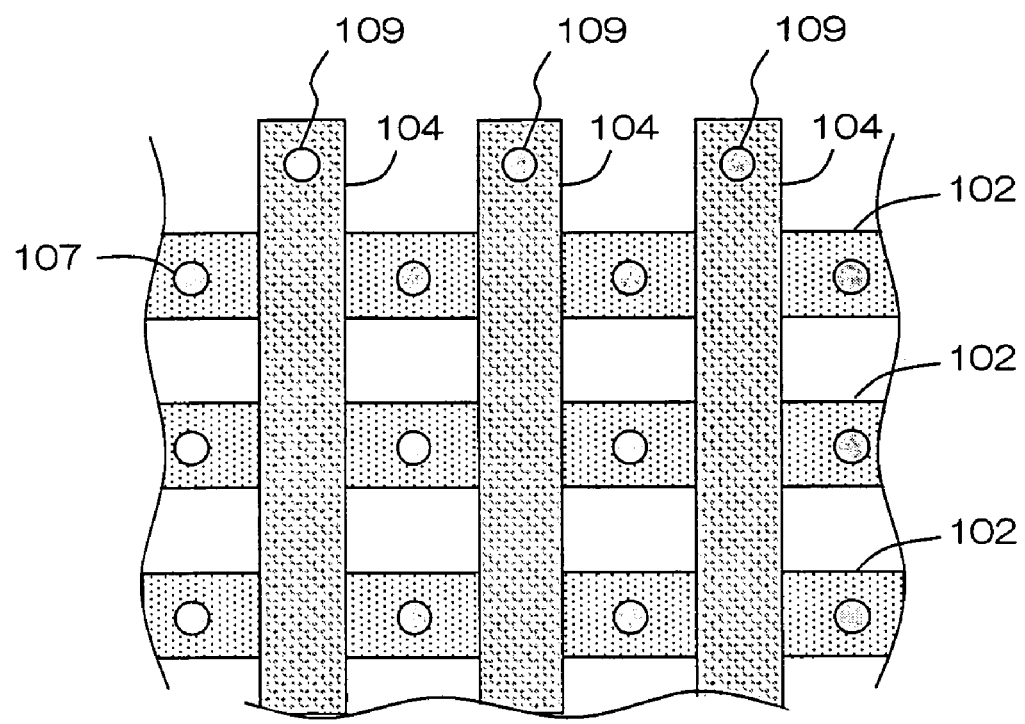
FIG. 2 is a plan view of a prior art compensation capacitor having many unit cells which are arranged in array.
Figure 3:
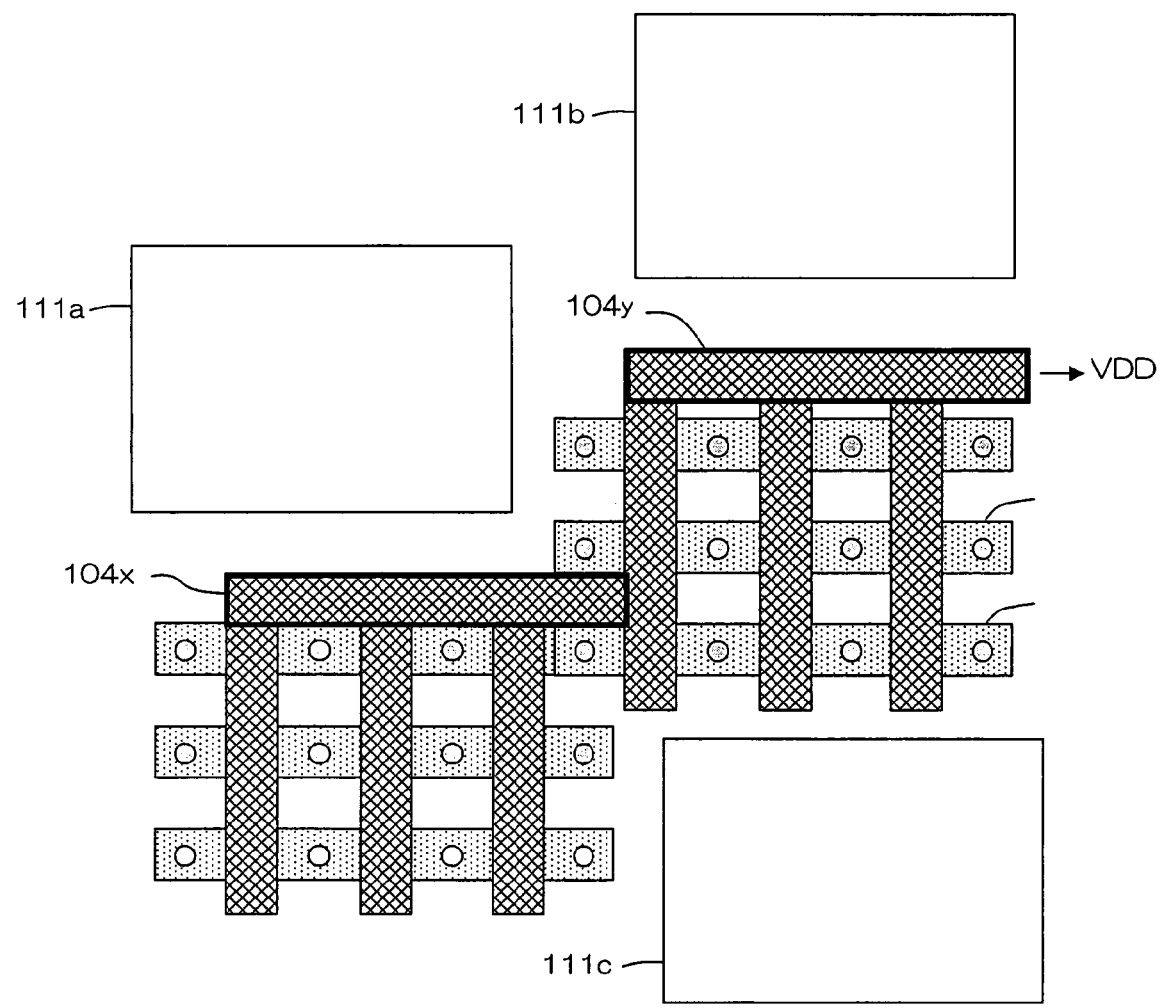
FIG. 3 is a top plan view of a prior art compensation capacitor that is arranged in the vicinity of obstacles.

As described above, according to a semiconductor device of the present invention, a diffusion layer, a gate electrode layer, and a metal film are formed in a mesh form, and electric connection can be easily secured in each layer. As a result, a compensation capacitor can be arranged with a high degree of freedom even on a substrate on which many obstacles are formed. As will be apparent from the comparison between FIG. 3 and FIG. 7, a decrease in operational efficiency cannot avoided for a prior art compensation capacitor, because a prior art compensation capacitor, which must be in an irregular form when it is provided in a congested space, needs additional wiring, and because dummy patterns are required for CMP polishing even if a compensation capacitor is not provided. On the other hand, a compensation capacitor of the present invention can be provided even in a congested space without requiring additional processes, as illustrated in FIG. 7. This allows an efficient circuit arrangement of DRAM and can prevent an increase in chip size. If the chip size is unchanged, more compensation capacitors can be provided to improve the performance of DRAM. Further, since the compensation capacitor serves as a dummy pattern, a flatter surface can be obtained through polishing, and defects such as short circuits are prevented, leading to an improvement in yield.

Although a certain preferred embodiment of the present invention has been shown and described in detail, it should be understood that various changes and modifications may be made without departing from the spirit or scope of the appended claims.

What is claimed is:

1. A semiconductor device comprising:
    an internal power supply for supplying power to a circuit element; and
    a compensation capacitor for supplying power to said internal power supply,
    wherein said compensation capacitor includes:
    a charge accumulating element having a diffusion layer, a dielectric layer, and a gate electrode layer, wherein said gate electrode layer, said dielectric layer, and said diffusion layer are stacked in this order, and at least partially overlap with each other when viewed from a direction of stacking;
    a metal layer for applying a voltage to said diffusion layer, said metal layer being formed above said charge accumulating element; and
    a contact for electrically connecting said diffusion layer and said metal layer, said contact extending between said diffusion layer and said metal layer in the direction of stacking,
    wherein said gate electrode layer has a form of a mesh which extends in a direction which is perpendicular to the direction of stacking, and
    wherein said contact extends through an aperture of the mesh of said gate electrode layer, wherein:
    said diffusion layer has rectangular apertures, wherein at least a part of said apertures are arranged in a matrix, and
    said gate electrode layer has a plurality of columns and a plurality of rows, wherein each column and each row are in a substantially perpendicular relationship to one another, and wherein a center line of each column and a center line of each row substantially pass through a center of said corresponding rectangular aperture.

2. The semiconductor device according to claim 1, wherein said metal layer has a mesh which extends in the direction which is perpendicular to the direction of stacking.

3. The semiconductor device according to claim 1, wherein said diffusion layer has an aperture ratio of approximately 50%.

4. A semiconductor device having a capacitor, the capacitor comprising a lower electrode formed in a mesh shape having a plurality of first apertures, an upper electrode formed in a mesh shape having a plurality of second apertures, and a dielectric film intervening between the lower electrode and the upper electrode, the lower electrode and the upper electrode being disposed such that a center point of each of the first apertures deviates from a center point of each of the second apertures, wherein the lower electrode is made of a diffusion region formed in a plurality of rows and columns to define the first apertures, and the upper electrode being made of a gate electrode formed in a plurality of rows and columns to define the second apertures, each of the first apertures being larger in area than each of crossing portions of the rows and columns of the upper electrode, wherein the lower and upper electrodes are electrically connected to first and second power supply lines, respectively.

\* \* \* \* \*